US008631923B1

United States Patent
Sze et al.

(10) Patent No.: US 8,631,923 B1
(45) Date of Patent: Jan. 21, 2014

(54) DEVICE SORTING APPARATUS

(71) Applicants: Chak Tong Sze, Kwai Chung (HK); Pei Wei Tsai, Kwai Chung (HK); Wai Hong Sizto, Kwai Chung (HK); Chunbai Wang, Kwai Chung (HK); Wai Chuen Gan, Kwai Chung (HK); Shing Wai Tam, Kwai Chung (HK)

(72) Inventors: Chak Tong Sze, Kwai Chung (HK); Pei Wei Tsai, Kwai Chung (HK); Wai Hong Sizto, Kwai Chung (HK); Chunbai Wang, Kwai Chung (HK); Wai Chuen Gan, Kwai Chung (HK); Shing Wai Tam, Kwai Chung (HK)

(73) Assignee: ASM Technology Singapore Pte Ltd, Singapore (SG)

( * ) Notice: Subject to any disclaimer, the term of this patent is extended or adjusted under 35 U.S.C. 154(b) by 0 days.

(21) Appl. No.: 13/630,071

(22) Filed: Sep. 28, 2012

(51) Int. Cl.
*B65G 37/00* (2006.01)

(52) U.S. Cl.
USPC ............................ 198/348; 198/358; 209/690

(58) Field of Classification Search
USPC ................... 198/348, 358, 349.3, 349.6, 363; 209/689, 690
See application file for complete search history.

(56) References Cited

U.S. PATENT DOCUMENTS

| | | | | |
|---|---|---|---|---|
| 2,892,689 A * | 6/1959 | Rushford | ....................... | 209/689 |
| 3,998,237 A * | 12/1976 | Kressin et al. | .................... | 453/6 |
| 4,233,499 A * | 11/1980 | Formby | ..................... | 198/349.3 |
| 4,373,624 A * | 2/1983 | Molins et al. | ................. | 198/358 |
| 4,549,660 A * | 10/1985 | Werling | ........................ | 209/690 |
| 2009/0014280 A1 * | 1/2009 | Jeter et al. | ..................... | 198/358 |
| 2010/0268376 A1 * | 10/2010 | Janet et al. | .................... | 221/221 |

* cited by examiner

*Primary Examiner* — James R Bidwell
(74) *Attorney, Agent, or Firm* — Ostrolenk Faber LLP

(57) ABSTRACT

A device sorting apparatus 100 is disclosed herein. In a described embodiment, the device sorting apparatus 100 comprises a plurality of bin connectors 120 for coupling to respective bins for storing sorted devices and a rotary distribution module 102 for receiving a device 200 to be sorted and for discharging the device 200 selectively into one of the bin connectors 120 to enable the device 200 to be unloaded to the respective bin. The device sorting apparatus 100 further comprises a sensor 110 coupled to the rotary distribution module 102 for detecting the discharge of the device 200, and which is rotatable together with the rotary distribution module 102; and a rotary transformer 400 for powering the sensor 110.

11 Claims, 8 Drawing Sheets

DEVICE SORTING APPARATUS

BACKGROUND AND FIELD

This invention relates to a device sorting apparatus, more particularly but not exclusively, for sorting Light Emitting Diodes (LEDs).

During electronic device manufacturing, it is common to implement quality tests and checks to determine the quality of electronic/electrical components, such as LEDs, for sorting. Indeed, in the case of LEDs, the LEDs may vary in brightness, colour and other parameters or characteristics and after testing of the LEDs, it is critical that the LEDs are sorted into bins according to their respective binning or electrical characteristics. Very often, a device sorting apparatus such as a high speed binning and sorting system is used to sort the LEDs. Such a system has a plurality of bins for storing LEDs according to their binning characteristics and a distribution module for distributing the tested LEDs to the correct bins. It is particularly useful for the distribution module to be of a rotary type and the distribution module would include a sensing device coupled thereto for detecting that a current LED in the distribution module has been unloaded before the next LED can be loaded into the distribution module. This is to ensure that devices are not wrongly mixed. Since the sensing device rotates together with the distribution module, sensor cables or wires attached to the sensing device needs to be of a certain length to allow the sensing device to rotate, or the distribution module (and the sensing device) needs to rotate bidirectionally to avoid twisting or breaking the cables or wires so as to prevent damage thereto.

It is an object of the present invention to provide a device sorting apparatus which addresses at least some of the disadvantages of the prior art,

SUMMARY

In accordance with a first aspect of the invention, there is provided a device sorting apparatus, comprising a plurality of bin connectors for coupling to respective bins for storing sorted devices; a rotary distribution module for receiving devices to be sorted and for discharging the devices selectively into corresponding bin connectors to enable the devices to be unloaded to the respective bins; a sensor coupled to the rotary distribution module for detecting the discharge of each device, and which is rotatable together with the rotary distribution module; and a rotary transformer having a primary transformer portion including a primary winding and a secondary transformer portion including a secondary winding, the secondary transformer portion and the primary transformer portion being separated by a gap and are rotatable relative to one another; the primary and secondary windings configured to transfer power between the primary and secondary transformer portions for powering the sensor.

An advantage of the described embodiment is that with the "contactless" or wireless" arrangement to transmit power to the sensor, the sensor may rotate freely together with the rotary distribution module without risk of twisting or breaking sensor cables. This also improves the performance of the device sorting apparatus since the rotary distribution module may rotate uni-directionally to achieve a shortest possible offload path.

Preferably, the secondary transformer portion includes a rotor core configured to rotate together with the rotation of the sensor. More preferably, the rotary distribution module is configured to rotate about a same rotary axis as the rotor core. In this way, a more compact device sorting apparatus may be achieved.

The gap may have a width of about 2 mm or less than 2 mm. In this way, a closer electromagnetic coupling between the primary and secondary windings may be achieved, and thus maximizes the energy transfer efficiency.

The device sorting apparatus may further comprise an encoder for determining an angular movement of the rotary distribution module and the encoder may have an encoder shaft for coupling to the secondary transformer portion. The device sorting apparatus may also have a secondary clamping device for clamping to the secondary transformer portion with the secondary clamping device being coupled to the encoder shaft.

Preferably, the device sorting apparatus may further comprise a primary device for securing to the primary transformer portion, the primary device being coupled to an end piece with screws which is fixedly mounted to a housing of the device sorting apparatus.

The device sorting apparatus may further comprise a sensor interface for transmitting a signal from the sensor to the primary transformer portion via the secondary transformer portion and the gap, the signal being used by a controller to determine when each device is discharged out of the distribution module. The device sorting apparatus may further comprise a sensor amplifier for amplifying signals to or from the sensor.

Advantageously, the device sorting apparatus may be configured to sort LEDs and in a second aspect of the invention, there is provided a LED sorting apparatus comprising the device sorting apparatus as described above.

It should be appreciated that features relating to one aspect may also be applicable to the other aspects.

BRIEF DESCRIPTION OF THE DRAWINGS

Examples of the invention will now be described with reference to the accompanying drawings, in which.

DETAILED DESCRIPTION

Figure 1:
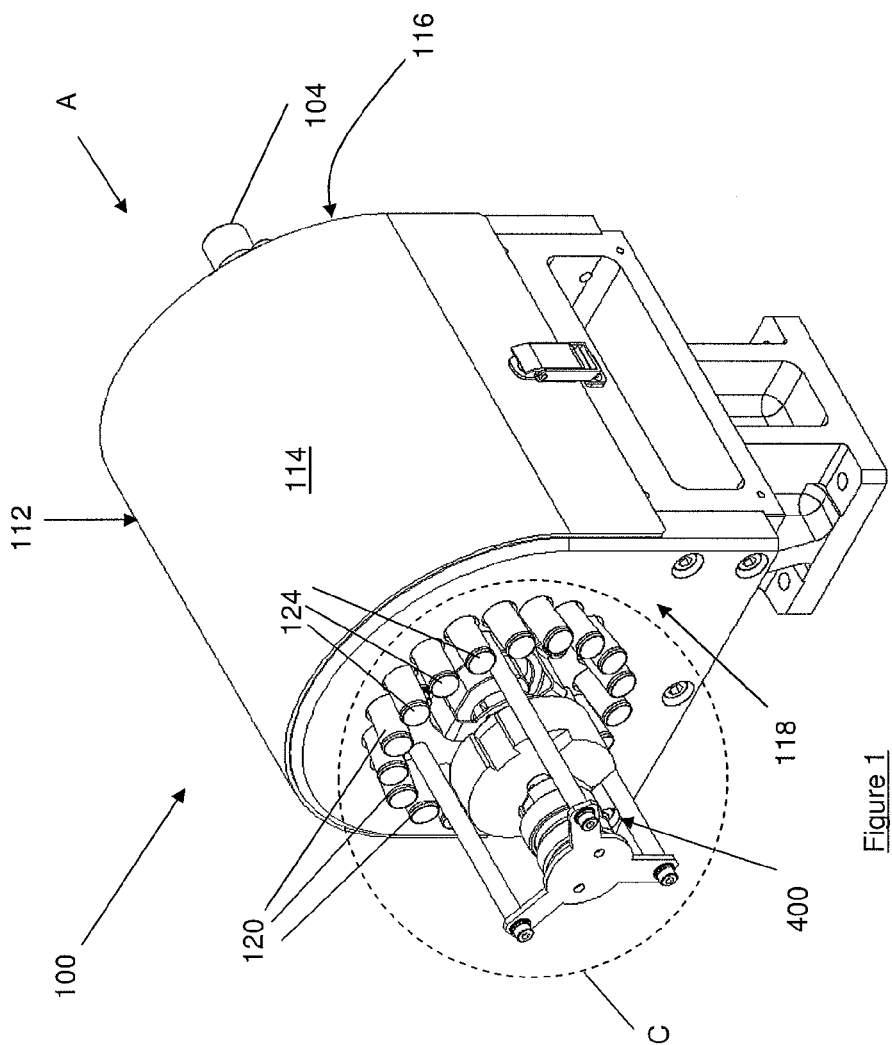
FIG. 1 is a perspective view a device sorting apparatus according to an embodiment of the invention.
Figure 2:
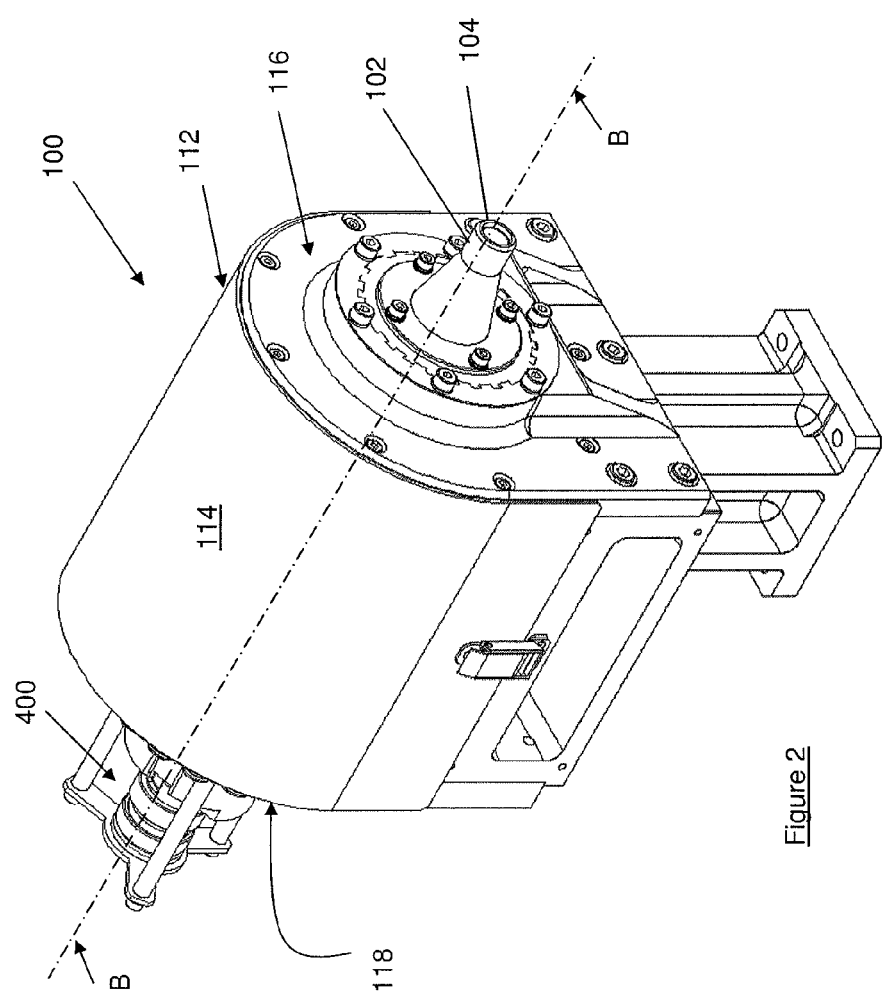
FIG. 2 is another perspective view of the device sorting apparatus of FIG. 1 as viewed from direction "A"
Figure 3:
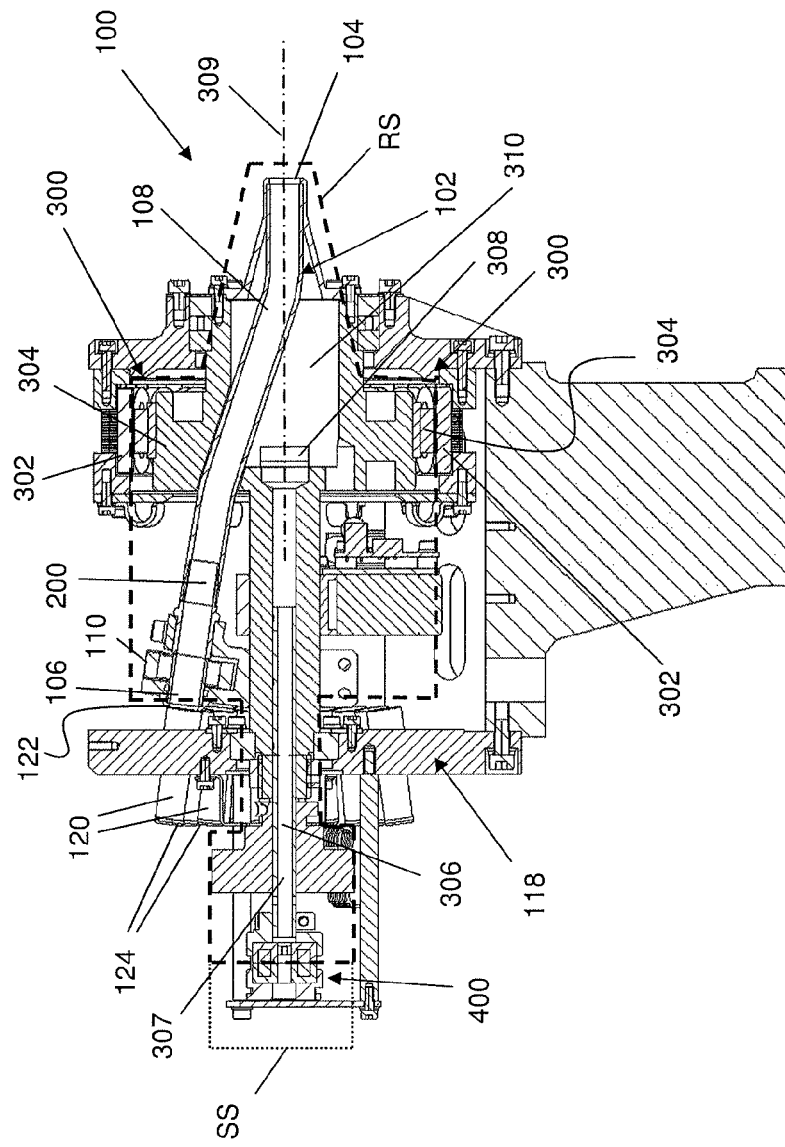
FIG. 3 is a cross sectional view of the device sorting apparatus of FIG. 2 as viewed from direction BB.

FIG. 1 is a perspective view of a device sorting apparatus 100 for sorting devices, for example, light emitting diodes (LEDs) or other electronic components, received from a test handler (not shown). FIG. 2 is a perspective view of the device sorting apparatus 100 of FIG. 1 as viewed from direction A. FIG. 3 is a cross-sectional view of the device sorting apparatus 100 along the direction B-B of FIG. 2.

The device sorting apparatus 100 includes a rotary distribution module 102 having an inlet 104 and an outlet 106. The inlet 104 is coupled to an output of a test handler (not shown) which tests the devices to determine their different binning characteristics (e.g. electrical characteristics, and in the case of LEDs, characteristics such as optical output and thermal characteristics) and to classify them accordingly. The tested devices are next loaded to the device sorting apparatus 100 to be sorted and binned into respective bins (not shown) according to their binning characteristics.

The inlet 104 is configured to receive a device 200 to be sorted and directs this into a hollow pipe-like member 108 or channel of the rotary distribution module 102. The pipe-like member 108 has a gradually elevated side profile such that the inlet 104 is located at a lower horizontal plane than the outlet 106 of the rotary distribution module 102, as shown in FIG. 3. The pipe-like member 108 is adapted to allow smooth passage of the device 200 from the inlet 104 to the outlet 106 and in particular, when the device 200 is caused to travel through the pipe-like member 108 using pressurized air, i.e. the device 200 is blown from the inlet 104 to the outlet 106.

The device sorting apparatus 100 further includes a rotary motor 300 having a stator 302 and a rotor 304 separated from the stator 302 by a motor air gap (not shown). The stator 302 includes a stator coil wound around a ferrite core and when magnetized, a magnetic force is created to rotate the rotor 304. The motor rotor 304 is arranged to drive an inserted shaft 306 through a channel 307, which comprises a first end 308. The first end 308, in turn, is joined to a coupling member 310 to form a one-piece structure, the coupling member 310 being for coupling to the rotary distribution module 102. When the rotary shaft 306 rotates, this drives the coupling member 310 to rotate which in turn, rotates the distribution module 102 about the rotary shaft 306. In other words, the distribution module 102 is arranged so that its rotary axis 309 is aligned with the rotating axis of the rotary shaft 306.

The device sorting apparatus 100 includes an optical sensor 110 (or generally a sensor) mounted to the distribution module 102 and thus, the optical sensor 110 rotates together with the distribution module 102. Specifically, the optical sensor 110 is mounted near to the outlet 106 of the distribution module 102 and is configured to detect the discharge of the device 200 from the distribution module 102. With the device 200 discharged from the distribution module, the device sorting apparatus 100 is able to receive the next device to be sorted and in this way, prevents incorrect binning of the devices.

As would be appreciated, on detecting the discharge of the device 200, the optical sensor 110 generates a control signal to inform a main controller (not shown) which controls when the next device is blown into the inlet 104 of the distribution module 102. Besides sensing the discharge of the device 200, the optical sensor 110 is also configured to count the devices which are discharged from the distribution module 102.

The device sorting apparatus 100 includes a motor housing 112 which houses the rotary motor 300 and a major part of the distribution module 102. As shown in FIGS. 1 and 2, the motor housing 112 has an arc-shaped body 114 and first and second end portions 116,118 which cover the arc shaped body 114 at both ends. Part of the distribution module 102, in particular the inlet 104, protrudes out of the first end portion 116 of the motor housing 112. The device sorting apparatus 100 further includes a plurality of bin connectors 120 arranged in a circle and protruding out of the second end portion 118 of the motor housing 112.

Each of the bin connectors 120 is cylindrical in shape and includes a connector inlet 122 which extends inside of the motor housing 112 and a connector outlet 124 which protrudes out of the second end portion 118 of the motor housing 112. A shape and dimension of each of the connector inlets 122 is configured to correspond with the shape and dimension of the outlet 106 to enable a seamless transfer of the device 200 to one of the selected bin connectors 120 in order for the device 200 to be unloaded to one of the selected bins according to its binning characteristics.

Figure 4:
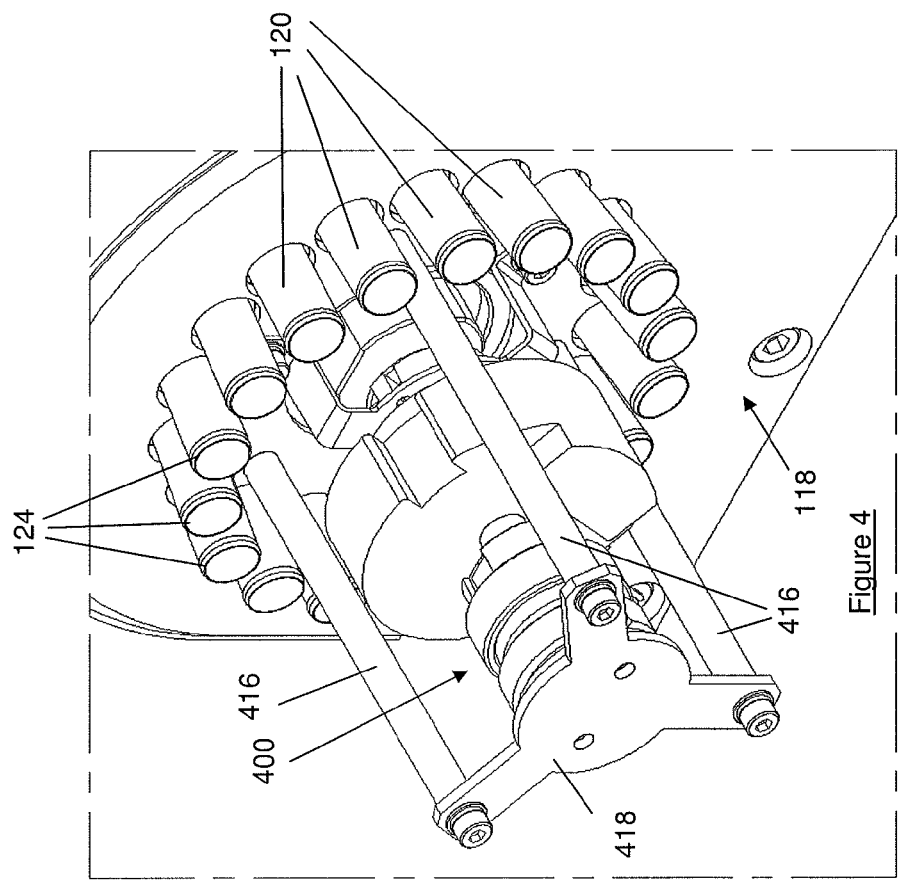
FIG. 4 is a close-up view of portion C of FIG. 1 to illustrate a rotary transformer of the device sorting apparatus.
Figure 5:
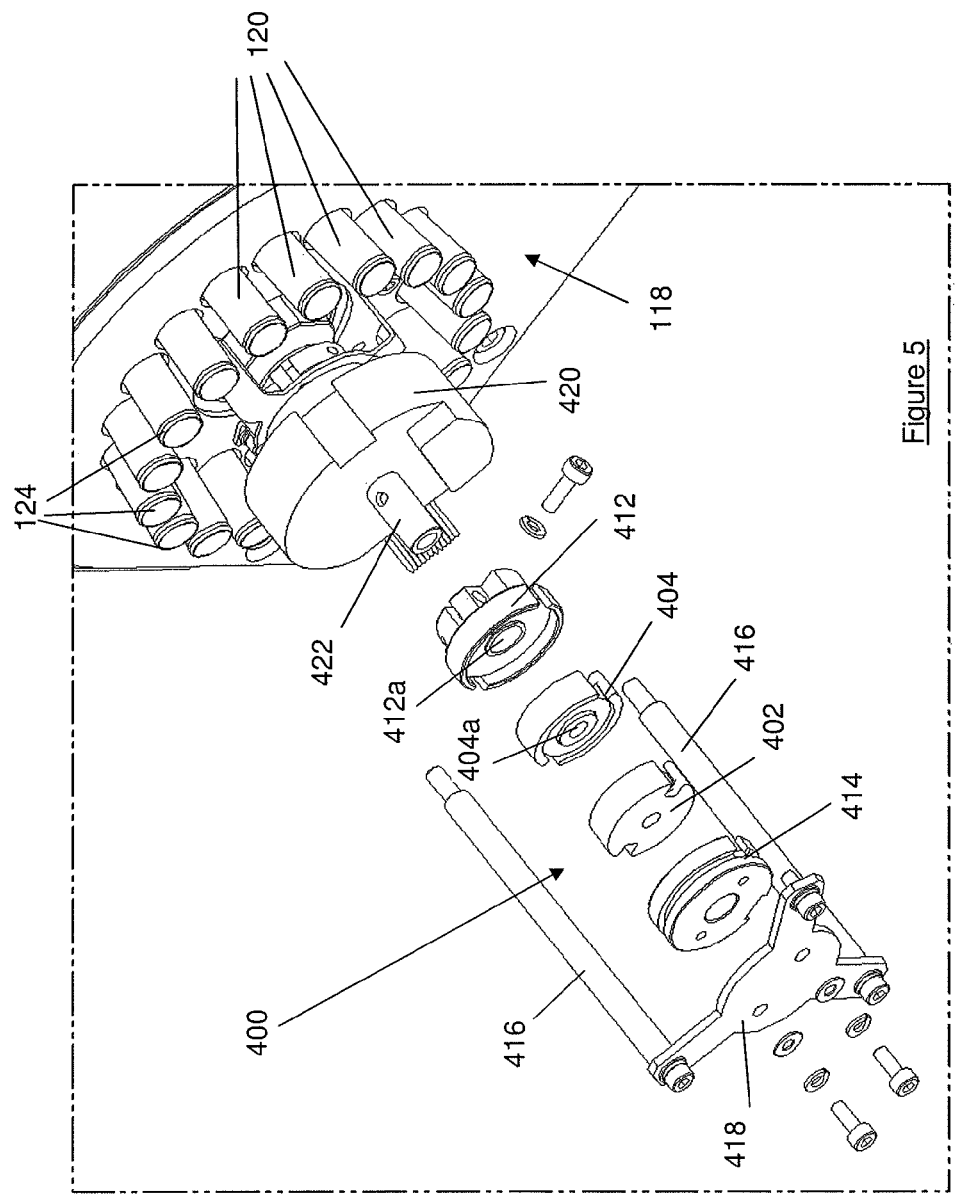
FIG. 5 is an exploded view of various parts of the rotary transformer of FIG. 4.
Figure 6:
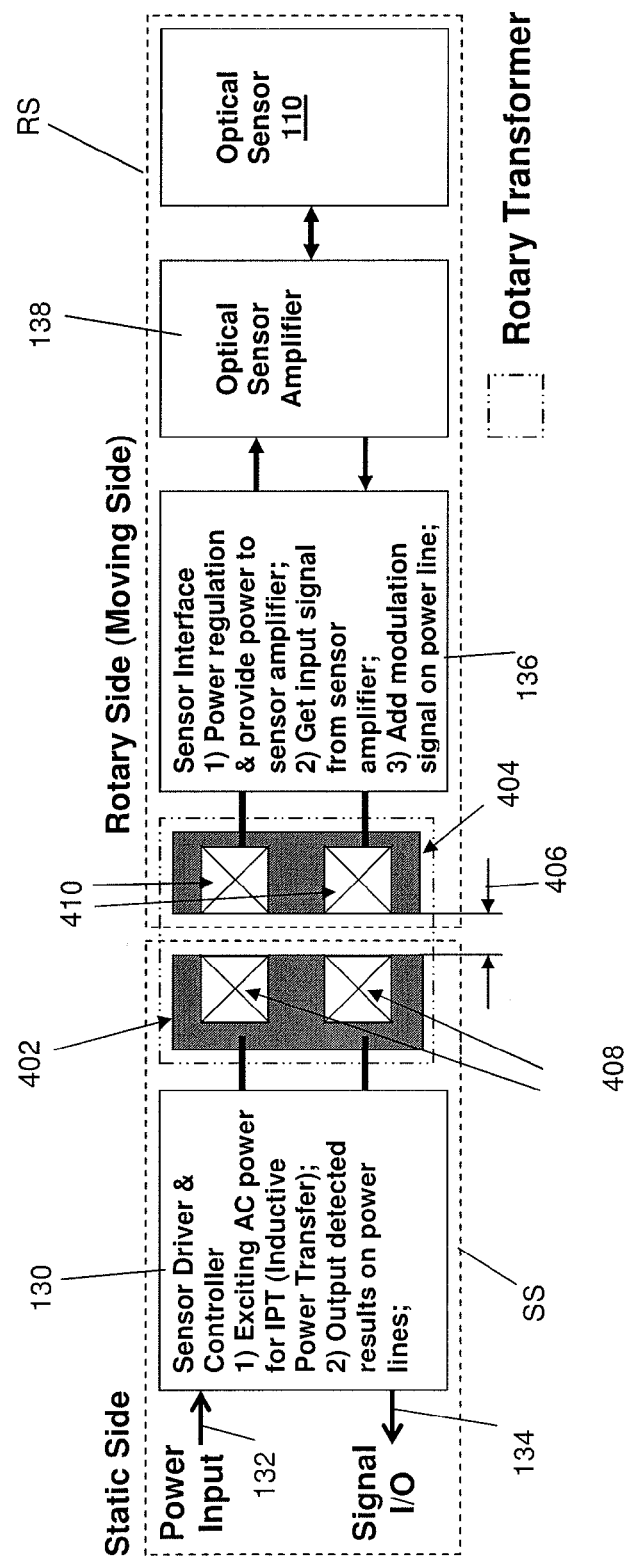
FIG. 6 is an electrical schematic diagram of the rotary transformer of FIG. 4 including an optical sensor.

The device sorting apparatus 100 includes a rotary transformer 400 for providing power to the optical sensor 110 and the rotary transformer 400 is shown more clearly in FIG. 4 which is an enlarged view of portion C of FIG. 1. FIG. 5 is an exploded view of various parts of FIG. 4 to illustrate these parts more clearly. FIG. 6 is an electrical schematic diagram of the rotary transformer of FIGS. 4 and 5, and other parts of the device sorting apparatus 100.

The rotary transformer 400 includes a primary transformer portion in the form of a ferrite stator core 402 and secondary transformer portion in the form of a ferrite rotor core 404 separated by an air gap 406 (see FIG. 6). The ferrite stator core 402 includes primary windings 408 and the ferrite rotor core 404 includes secondary windings 410 and the primary and secondary windings 408,410 are configured to induce power transfer between the ferrite stator core 402 and the ferrite rotor core 404 to power the optical sensor 110. In this embodiment, the primary to secondary windings ratio is configured to be around 80:120 so that a secondary voltage at the ferrite rotor core 402 is about 1.5 times of a primary voltage at the ferrite stator core 402. Further, in this embodiment, the stator and rotor cores 402,404 each has a diameter of about 22 mm so that the rotary transformer 400 may be "embedded" on, or coupled to, the rotary motor 300. Also, a material of the stator and rotor cores 402, 404 is N48 from EPCOS which is selected to match the circuit's operating frequency of <1 MHz.

To secure the rotary transformer 400 to the motor housing 112 of the device sorting apparatus 100, the device sorting apparatus 100 includes a rotor G-clamp 412 and a stator holder 414, both being metallic. The device sorting apparatus 100 also includes three support rods 416 for supporting the rotary transformer 400 and a star-shaped end piece 418.

In this embodiment, the device sorting apparatus 100 further includes an encoder 420 for measuring angular movement of the rotary shaft 306. The encoder 420 is coupled to and rotates in unison with the rotary shaft 306. The encoder 420 further includes an encoder shaft 422 for receiving the rotor G-clamp 412.

Figure 7:
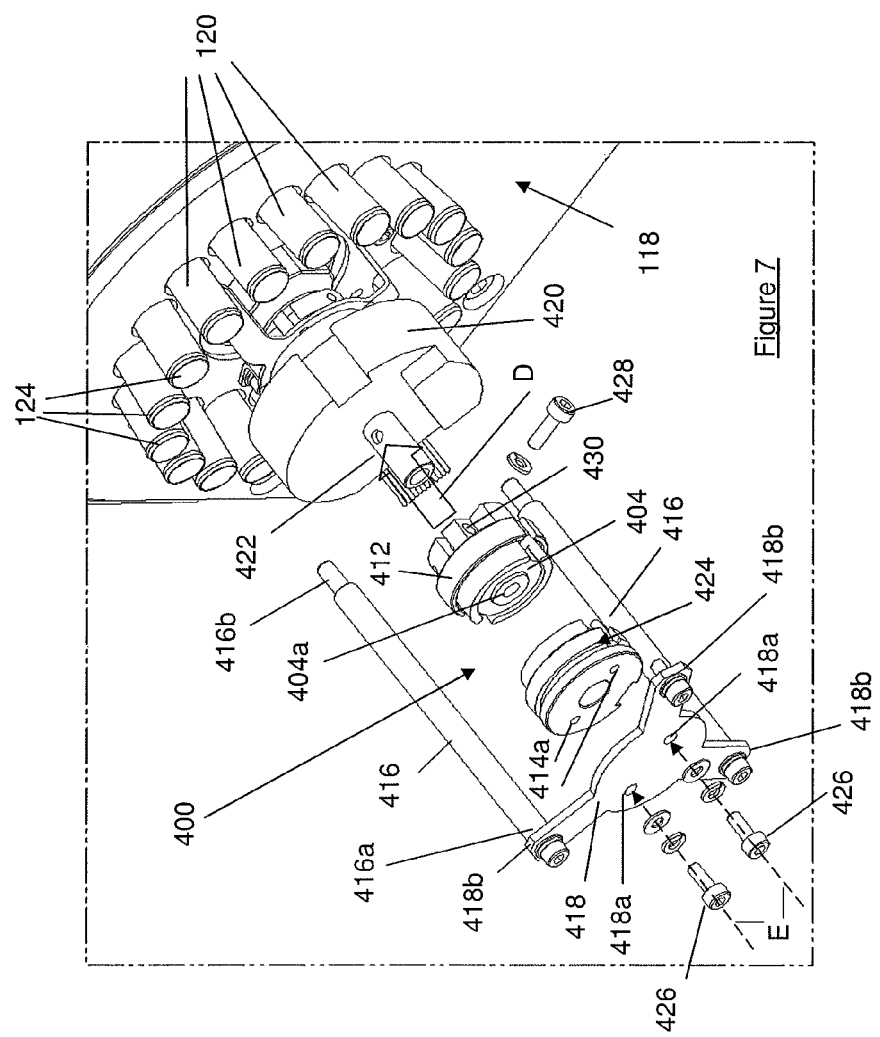
FIGS. 7 and 8 illustrate steps the assembly of the rotary transformer of the device sorting apparatus of FIG. 1.

To mount the rotary transformer 400 to the device sorting apparatus 100, the ferrite rotor core 404 is releasably clamped by the rotor G-clamp 412 to the encoder shaft 422 and thereby to the rotary shaft 306, for example through the use of adhesive to adhere the ferrite rotor core 404 to the rotor G-clamp 412 temporarily. It should be appreciated that the rotor G-clamp 412 includes a centre aperture 412a and this is aligned with a rotor aperture 404a of the ferrite rotor core 404. Next, the ferrite rotor core 404 and the rotor G-clamp 412 are attached to the encoder shaft 422 by inserting the encoder shaft 422 through the centre aperture 412a of the rotor G-clamp 412 and the rotor aperture 404a, as illustrated in FIG. 7—see arrow D.

The ferrite stator core 402 is secured by the stator holder 414 to the star-shaped end piece 418 of the device sorting apparatus 100 in a similar manner as the ferrite rotor core 404 to form a clamped stator assembly 424 and if appropriate, adhesive is used to adhere the stator core 404 to the stator holder 414. The clamped stator assembly 424 is fixed to the end piece 418 using screws 426 so that the stator core 402 faces the rotor core 404. The screws 426 are inserted through mounting apertures 418a of the end piece 418 (see arrows E) and secured to threaded holes 414a of the stator holder 414.

Each leg 418b of the end piece 418 is connected to respective first ends 416a of the support rods 416 with second ends 416b of the support rods 416 inserted into corresponding mounting holes (not shown) in order for the support rods 416 to be fixedly coupled to the second end portion 118. In this arrangement, the stator core 402 (and thus, the clamped stator assembly 424) is now fixed. Next, a 2 mm thick spacing is provided between the stator core 402 and the rotor core 404. It should be apparent that the thickness of the spacing defines the gap 406 between the ferrite stator core 402 and the ferrite rotor core 404.

As explained earlier, the rotor core 404 is releasably coupled to the rotor G-clamp 412 and thus, the rotor core 404 may then be slid outwards of the G-clamp 412 along the encoder shaft 422 (i.e. away from the second end portion 118) and towards the stator core until the 2 mm thick spacing is provided between the rotor core 404 and the stator core 402. At this stage, a locking screw 428 is then inserted into a locking hole 430 of the rotor G-clamp 412 to lock the rotor G-clamp 412 against the rotor core 404 so as to clamp the rotor core securely and also to tighten the rotor G-clamp 412 against the encoder shaft 422. With the rotor core 404 locked (but rotatable), the gap 406 or distance between the stator core 402 and the rotor core 404 is maintained.

Figure 8:
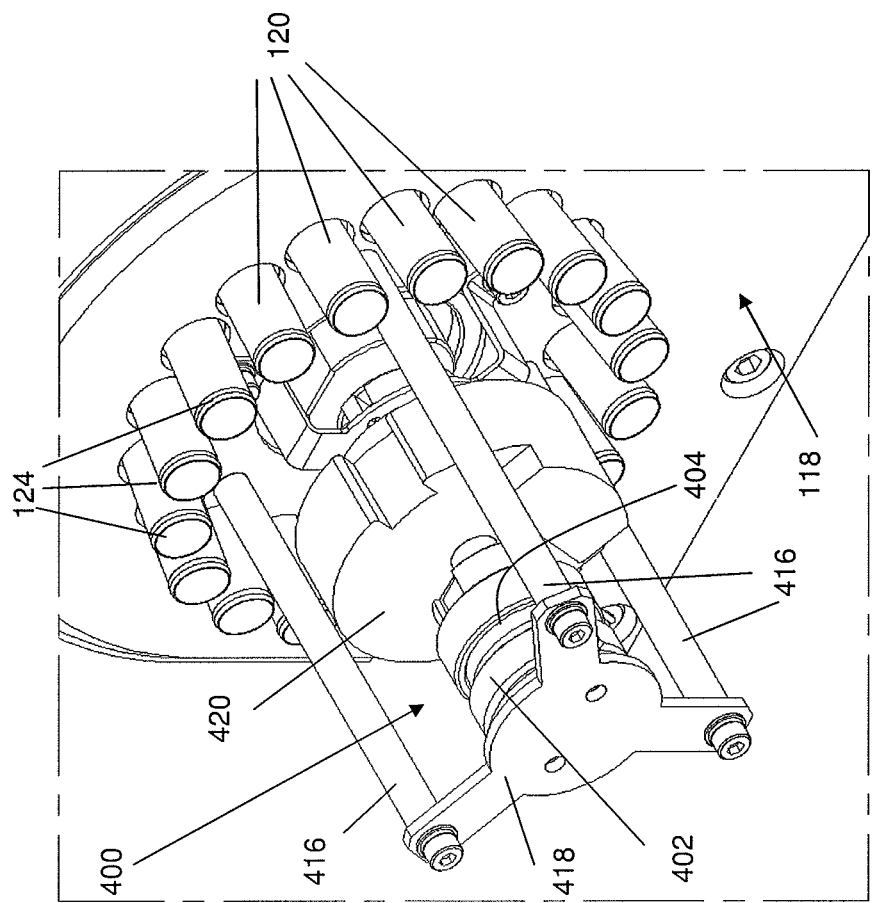

When the rotor core 404 is locked or securely tightened as described above, the 2 mm air gap 406 is thus created between the stator core 402 and the rotor core 404, and the assembled rotary transformer 400 is shown in FIG. 8.

As explained earlier, the rotary transformer 400 is configured to supply power for powering the optical sensor 110 and in this embodiment, the rotary transformer 400 is also configured for transferring electric signals, such as data, between the ferrite stator core 402 and the ferrite rotor core 404.

As shown in FIG. 6, the device sorting apparatus 100 includes a sensor driver and a controller 130 having a power input 132 for receiving power from a power source and a signal I/O 134 for transmitting signals from the rotary transformer 400 to other devices. The sensor driver and controller 130 is arranged to energise the ferrite stator core 402 to induce power transfer to the ferrite rotor core 404 via the air gap 406.

In this embodiment, the air gap 406 is about 2 mm wide and it has been found that it is advantageous for the air gap to be <2 mm so that a close electromagnetic coupling is ensured and electrical energy from the ferrite stator core 402 is coupled to the ferrite rotor core 404 (which is rotating) more efficiently without use of a resonance circuit. Another consideration is that the concentricity between the two cores 402,404 should be controlled to within +/−0.5 mm in order to maximize the energy transfer efficiency.

At the ferrite rotor core side, the device sorting apparatus 100 includes a sensor interface 136 which regulates the power received by the ferrite rotor core 404 and to produce a regulated power for an optical sensor amplifier 138 which produces an amplified power signal for driving the optical sensor 110. As explained earlier, the optical sensor 110 is arranged to detect the discharge of the device 200 from the distribution module 102 and the control signal is next passed to the optical sensor amplifier 138 for amplification to produce an amplified control signal. The amplified control signal is next passed on to the sensor interface 136 which generates a modulating signal based on the amplified control signal and modulates the power signal using the modulating signal for transfer from the rotor core 404 to the stator core 402. On receipt of the modulating signal at the stator core 402, the modulating signal is demodulated by the sensor driver and controller 130 to recover the control signal which is then transmitted to the main controller (not shown) via the signal I/O 134. Based on the control signal, the controller would then be able to determine if the device 200 has been discharged from the distribution module 102 before allowing another device to be introduced into the distribution module 102.

When the device sorting apparatus is operating, the ferrite rotor core 404 is thus rotatable relative to the stationary ferrite stator core 402. When a primary current is applied to the ferrite stator core 402, this induces a power transfer to the ferrite rotor core 404 via the air gap 406 to provide the necessary power for powering the optical sensor 110. Since the optical sensor 110 is mounted to the distribution module 102 which rotates to align the outlet 106 with the connector inlet 122 of a selected one of the bin connectors 120, the optical sensor 110 is also rotating together with the distribution module 102. FIGS. 3 and 6 outline a moving or rotary portion RS to represent generally the rotating parts and the stationary portion SS to represent generally the stationary parts of the device sorting apparatus 100.

As would be appreciated, since the power transfer to the optical sensor 110 is done wirelessly via the rotary transformer, the optical sensor 110 and thus, the distribution module 102 has freedom to move in a shortest path to align the outlet 106 to a selected bin connector 120 without worry of twisting or breaking of cables. In other words, with the contactless ferrite stator core 402 and ferrite rotor core 404 arrangement, this improves the performance and efficiency of the device sorting apparatus 100 and also has a benefit of improving magnetic coupling efficiency. Further, such an arrangement may also achieve high audio frequency band of <1 MHz with reduction of both EMI and audible noise. The throughput of the device sorting apparatus 100 may also improve since the distribution module 102 may travel the shortest rotary path to discharge the device 200 to the correct bin.

The described embodiments should not be construed as limitative. For example, width of the air gap 406 may be adjusted accordingly and need not necessarily be 2 mm. Also, the rotary shaft 306 may not rotate with the distribution module 102 about the same rotation axis 308, although it is preferred.

The encoder 420 may not be necessary and other ways of determining the angular distance/movement may be used. In this case, the ferrite rotor core 402 (and the rotor G-clamp 412) may be coupled directly to the rotary shaft 306.

Although the described embodiment is particularly useful for sorting LEDs according to their different electrical characteristics, it should be appreciated that the device sorting apparatus 100 may also be used to sort other electronic or electrical components.

Having now fully described the invention, it should be apparent to one of ordinary skill in the art that many modifications can be made hereto without departing from the scope as claimed.

The invention claimed is:

1. A device sorting apparatus, comprising
a plurality of bin connectors for coupling to respective bins for storing sorted devices;
a rotary distribution module for receiving devices to be sorted and for discharging the devices selectively into corresponding bin connectors to enable the devices to be unloaded to the respective bins;
a sensor coupled to the rotary distribution module for detecting the discharge of each device, and which is rotatable together with the rotary distribution module;
a rotary transformer having a primary transformer portion including a primary winding and a secondary transformer portion including a secondary winding, the secondary transformer portion and the primary transformer portion being separated by a gap and are rotatable relative to each other; the primary and secondary windings being configured to transfer power wirelessly from the primary transformer portion to the secondary transformer portion for powering the sensor.

2. A device sorting apparatus according to claim 1, wherein the secondary transformer portion includes a rotor core configured to rotate together with the rotation of the sensor.

3. A device sorting apparatus according to claim 2, wherein the rotary distribution module is configured to rotate about a same rotary axis as the rotor core.

4. A device sorting apparatus according to claim 1, wherein the gap has a width of 2 mm.

5. A device sorting apparatus according to claim 1, wherein the gap has a width of less than 2 mm.

6. A device sorting apparatus according to claim 1, further comprising an encoder for determining an angular movement of the rotary distribution module, the encoder having an encoder shaft for coupling to the secondary transformer portion.

7. A device sorting apparatus according to claim 6, further comprising a secondary clamping device coupled to the encoder shaft, the secondary clamping device being for clamping the secondary transformer portion to the encoder shaft.

8. A device sorting apparatus according to claim 1, further comprising a primary device coupled to an end piece which is fixedly mounted to a housing of the device sorting apparatus, the primary device being for securing the primary transformer portion to the end piece.

9. A device sorting apparatus according to claim 1, further comprising a sensor interface for transmitting a signal from the sensor to the primary transformer portion via the secondary transformer portion and the gap, the signal being operative to determine when each device is discharged out of the distribution module.

10. A device sorting apparatus according to claim 1, further comprising a sensor amplifier for amplifying signals to or from the sensor.

11. A LED sorting apparatus comprising the device sorting apparatus according to claim 1.

* * * * *